United States Patent
Ameen et al.

(10) Patent No.: US 6,635,569 B1
(45) Date of Patent: Oct. 21, 2003

(54) METHOD OF PASSIVATING AND STABILIZING A TI-PECVD PROCESS CHAMBER AND COMBINED TI-PECVD/TIN-CVD PROCESSING METHOD AND APPARATUS

(75) Inventors: Michael S. Ameen, Phoenix, AZ (US); Joseph T. Hillman, Scottsdale, AZ (US); Gert Leusink, Tempe, AZ (US); Michael Ward, Phoenix, AZ (US); Tugrul Yasar, Scottsdale, AZ (US)

(73) Assignee: Tokyo Electron Limited, Tokyo (JP)

( * ) Notice: Subject to any disclaimer, the term of this patent is extended or adjusted under 35 U.S.C. 154(b) by 700 days.

(21) Appl. No.: 09/063,196

(22) Filed: Apr. 20, 1998

(51) Int. Cl.$^7$ ................................................ H01L 21/44
(52) U.S. Cl. ........................ 438/680; 438/685; 134/1.1; 134/2
(58) Field of Search ................................ 438/680, 905, 438/694, 685; 134/1.1, 1.2, 4, 2

(56) References Cited

U.S. PATENT DOCUMENTS

| | | | |
|---|---|---|---|
| 3,807,008 A | | 4/1974 | Reedy, Jr. |
| 5,052,339 A | * | 10/1991 | Vakerlis et al. ............. 118/723 |
| 5,109,562 A | * | 5/1992 | Albrecht ........................ 15/56 |

(List continued on next page.)

FOREIGN PATENT DOCUMENTS

| | | |
|---|---|---|
| EP | 0387656 | 9/1990 |
| JP | 09205070 | 8/1997 |
| WO | 9843284 | 10/1998 |

OTHER PUBLICATIONS

Wolf Stanley, and Tuber Richard N., "Silicon Processing for the VLSI Era, vol. 1: Process Technology", U.S.P.T.O Scientific Library, pp. 173, 392, and 393, 1986.*

Wolf Stanley, "Silicon Processing for the VLSI Era, vol. 2: Process Integration", U.S.P.T.O Scientific Library, pp. 166, 167, 273, 274, 1990.*

Primary Examiner—Matthew Smith
Assistant Examiner—Renzo Rocchegiani
(74) Attorney, Agent, or Firm—Wood, Herron & Evans, L.L.P.

(57) ABSTRACT

A methodology is described by which a processing chamber used to deposit plasma-enhanced Ti-CVD films may be conditioned and passivated efficiently after either a wet cleaning or in-situ chemical cleaning, or after each successive deposition sequence. The technique allows a CVD process, such as, for example, a Ti-PECVD process, to recover film properties, such as resistivity, uniformity, and deposition rate, in a minimum time and following a minimum number of conditioning wafers, thereby improving the productivity of the system. The technique also maintains the stability of the system during continuous operation. This allows for the processing of thousands of wafers between in-situ cleaning of the chamber. Immediately following chamber cleaning and before performing the Ti-CVD process on wafers, the methodology includes forming a plasma with reactive gas to heat reactor components, then adding the coating material containing reactant to deposit the coating material onto the reactor components, then introducing an oxidizing or reducing gas into the chamber to stabilize the coating on the reactor parts, followed by resumption of the wafer coating process. During continuous operation in the Ti-CVD of wafers, the methodology includes introducing a mixture of Ar and $H_2$ gases forming a plasma to heat reactor components where necessary, then introducing and chemically reducing $TiCl_4$ to deposit Ti on the heated reactor components, then introducing oxidizing or reducing gas into the chamber for a period of time necessary to stabilize the Ti film. Preferably, $N_2$ and $NH_3$ are introduced and wafer passivation and reactor stabilization are performed simultaneously. Stabilization of the reactor only, and in some cases also the wafer, may use $NH_3$, $H_2O$, $O_2$ or other gases.

29 Claims, 2 Drawing Sheets

U.S. PATENT DOCUMENTS

| | | | |
|---|---|---|---|
| 5,158,644 A | * 10/1992 | Cheung et al. | 156/643 |
| 5,264,297 A | 11/1993 | Jindal et al. | |
| 5,271,963 A | * 12/1993 | Eichman et al. | 427/248 |
| 5,296,404 A | * 3/1994 | Akahori et al. | 437/173 |
| 5,326,723 A | * 7/1994 | Petro et al. | 437/192 |
| 5,416,045 A | 5/1995 | Kauffman et al. | |
| 5,477,975 A | * 12/1995 | Rice et al. | 216/68 |
| 5,487,922 A | 1/1996 | Nieh et al. | |
| 5,503,676 A | * 4/1996 | Shufflebotham et al. | 118/723 |
| 5,536,193 A | 7/1996 | Kumar | |
| 5,567,483 A | 10/1996 | Foster et al. | |
| 5,589,233 A | * 12/1996 | Law et al. | 427/579 |
| 5,591,672 A | 1/1997 | Lee et al. | |
| 5,593,511 A | 1/1997 | Foster et al. | 148/238 |
| 5,610,106 A | * 3/1997 | Foster et al. | 437/245 |
| 5,716,870 A | * 2/1998 | Foster et al. | 437/192 |
| 5,728,629 A | * 3/1998 | Mizuno et al. | 438/680 |
| 5,824,365 A | * 10/1998 | Sandhu et al. | 427/239 |
| 5,824,375 A | * 10/1998 | Gupta | 427/569 |
| 5,840,628 A | * 11/1998 | Miyamoto | 438/680 |

* cited by examiner

METHOD OF PASSIVATING AND STABILIZING A TI-PECVD PROCESS CHAMBER AND COMBINED TI-PECVD/TIN-CVD PROCESSING METHOD AND APPARATUS

This invention relates semiconductor substrate processing by the application of titanium coatings, particularly by plasma enhanced chemical vapor deposition (PECVD) methods. The invention more particularly relates to the cleaning and stabilizing of CVD reactors used in such processing and to the passivating and conditioning of such reactors following such cleaning and to maintaining the reactors in a stable state during the subsequent use of the reactors for Ti-PECVD processing of semiconductor substrates.

BACKGROUND OF THE INVENTION

Chemical vapor deposition (CVD), and particularly plasma enhanced chemical vapor deposition (PECVD) are processes that are being increasingly used in the application of titanium (Ti) or titanium-containing films to substrates in semiconductor manufacture. One such Ti-PECVD process is at least theoretically available to deposit titanium on contacts of features, particularly high aspect ratio features, on semiconductor wafers. In investigating contact level metallurgy in the course of arriving at the present invention, applicants have determined that production applications with such processes involve issues of process uniformity, process repeatability and process stability that are as important as the fundamental film properties and deposition characteristics.

One such issue is the cleaning methodology for the chamber of the reactor in which the CVD is carried out. Such reactors must be treated to remove accumulated reactants, reaction products and reaction by-products from the reactor surfaces. Materials that collect on these surfaces during the use of the reactor for Ti-CVD are often sources of peeling and contamination in the chamber, leading to a high number of particles which cause contamination of the surfaces of the wafers being processed resulting in interference with critical process reactions on the wafer. Also, accumulation of this material on the surfaces of a reactor can cause long term drifts in process parameters leading to unstable or unpredictable process performance and degraded process results. Furthermore, many CVD reactors that are available for Ti-CVD are provided with nickel alloy susceptors on which the wafers are supported for processing. Silicon wafers have a greater tendency to stick to a nickel alloy susceptor following the cleaning of the susceptor.

When the conditions of surfaces in a CVD reactor used for Ti-PECVD are changed, such as by cleaning the reactor to remove deposits that accumulate during deposition, changes occur in the deposition processes which stabilize only after some form of chamber conditioning. Applicants' empirical observation is that, following such changes in reactor conditions, there is either some amount of reactor operating time that must transpire or some number of wafers that must be processed in a reactor before the process stabilizes. Applicants believe that this effect is due to a change in the state of the reactor surfaces, due in part to film deposition on the surfaces which alters thermal emissivity, adhesive properties, electrical conductivity or other properties that directly affect the results on the processed wafers. It is desirable to minimize the amount of time devoted to the initial conditioning of a reactor following cleaning or other such condition changes of the reactor before the introduction of wafers into the chamber for processing, particularly in a manufacturing environment.

Deposition chambers are typically cleaned in one of two ways: 1) In situ cleaning, by which reactor surfaces are cleaned without opening the system to air, and preferably without cooling any parts of the chamber, and 2) wet cleaning, which generally entails cooling the reactor components, opening the system and wiping or scrubbing the reactor components with water or other chemicals to remove deposits from them. For both of these methods, applicants observe that the process must be recovered, that is, the chamber should be reconditioned, to stable baseline performance after the cleaning procedure has been carried out.

The Ti-PECVD process uses $TiCl_4$ and $H_2$ in a reduction reaction conducted in a plasma environment to form metallic Ti as the main reaction product and HCl as the main reaction by-product. During the course of this reduction reaction, other by-products may form, such as $TiCl_x$, with x<4. These products, along with metallic Ti, may be deposited on reactor surfaces to an extent that is strongly related to the chamber geometry and to the temperature distribution on the reaction chamber surfaces. Hot metallic surfaces, such as hot nickel alloy surfaces for example, when directly exposed to $TiCl_4$, have a tendency for metal chlorides to form thereon that may have a detrimental effect on process performance. For the PHOENIX™ system of applicants' assignee, for example, such reactor surfaces on which such undesirable deposition may tend to occur are the face of the substrate-supporting susceptor, the face of the process gas dispersing showerhead, and a limited region on the reactor walls located near the plane of the wafer and below. The composition of deposited material is related to the temperature of the surface on which it deposits and to the concentration of various reaction species, reactants, reaction products and reaction by-products at such surface.

For example, during continuous operation of a Ti-PECVD process, Ti bearing films accumulate on the internal surfaces of the reactor. The composition of these films range from Ti rich on the hotter surfaces to Cl rich on the colder surfaces of the reactor. These films are intrinsically unstable. The Ti rich films oxidize over time upon exposure to the residual water and oxygen that are present in the chamber. Since this oxidation has, in the prior art, been a highly uncontrolled process, it has been regarded as undesirable. During oxidation of these Ti rich films, their physical properties change from electrically conducting to electrically insulating, resulting in unstable and otherwise changing plasma and other characteristics within the chamber during the performance of coating processes. Cl rich films, on the other hand, have a relatively high vapor pressure and result in an uncontrolled background of $TiCl_x$(x<4) in the chamber. These $TiCl_x$ species contribute to the deposition reaction and result in unstable process characteristics.

The material that deposits on the walls and other reactor surfaces during the formation of titanium is very hygroscopic and deliquescent, reacting with residual water vapor and $O_2$, when present, to form a $TiO_2$-based film. The gettering properties of such Ti films are well known. $TiO_2$ film has the properties of being chemically stable and electrically non-conductive. Where a reactor having a titanium rich coating on its internal components must be opened for cleaning, these reactions accelerate, producing airborne reaction by-products and heat, which are hazards that must be controlled.

Titanium films that are deposited onto semiconductor wafers are usually followed by a passivation process by which a passivating layer of a stable substance such as titanium nitride is deposited on the surface of the titanium film. Where the Ti deposition process is one of CVD, the TiN film is formed in a dedicated reactor by the reaction of titanium with ammonia. The formations of the Ti and overlying TiN films is carried out in a multiple reactor tool having a Ti-CVD reactor and a TiN-CVD reactor connected to a transfer module through which wafers are transferred from the Ti-CVD module to the TiN-CVD module for successive processing.

There exists a need to more efficiently and effectively condition a reactor, particularly one used for the PECVD of titanium, following the cleaning of the reactor.

SUMMARY OF THE INVENTION

A primary objective of the present invention is to provide stable process performance in a Ti-PECVD apparatus.

A particular objective of the present invention is to provide a Ti-PECVD method and apparatus which maintains the reactor in a stable condition and maintains the stable performance of the Ti-PECVD process during continuous operation, particularly under semiconductor manufacturing operations.

Particular objectives of the present invention are to provide for the breaking in and stabilization of a PECVD reactor for Ti-PECVD processing following changes in reactor conditions, particularly following the changes in conditions that are brought about by the cleaning of internal reactor surfaces, such as by wet cleaning or by in-situ cleaning, and where the reactor is either opened or remains closed during a cleaning operation.

A further objective of the present invention is to provide an in-situ PECVD reactor cleaning process that facilitates reactor break-in, reactor and process recovery and process stabilization.

Certain aspects of the present invention are based in part upon the determination that chamber stabilization by oxidation or reduction/passivation of internal reactor surfaces, eliminates an uncontrolled source of Ti-containing species that are volatile enough to reach the wafer surface.

A particular objective of the present invention is to more efficiently and effectively condition a reactor following the cleaning thereof, particularly where such reactor is used for the PECVD of titanium.

A further objective of the present invention is to improve the efficiency of, and reduce the equipment required for, performance of successive Ti-CVD and TiN-CVD processes.

According to principles of the present invention, stabilized titanium bearing film is provided in a Ti-PECVD reactor as changes in reactor conditions occur. Such changes in reactor conditions include those brought about by the cleaning of internal reactor components which, for example, remove titanium bearing deposits from the surfaces of reactor components as well as those brought about by the use of the reactor, for example, to perform a Ti-PECVD process on a wafer which results in the formation of Ti bearing film deposits on reactor components.

In accordance with certain embodiments of the invention, a controlled oxidization or reduction/passivation of Ti bearing films is carried out in a Ti-PECVD reactor following changes in the nature or extent of Ti bearing films on the reactor components. In certain embodiments of the invention, a controlled deposition of reactants, reaction products, reaction by-products or related materials is provided in the chamber following the cleaning of the chamber. In other embodiments of the invention, a controlled presence of one or more oxidizing or reducing agents is provided in the chamber in the early stages of recovery following a cleaning of the chamber. Still in further embodiments of the invention, films formed on the surfaces of reactor components are oxidized or reduced, or are passivated, in a controlled way following the performance of a Ti-PECVD process in the reactor to maintain, in a stabilized state, the film that may deposit on the components during the performance of such process. Preferably, this controlled oxidation or reduction and passivation is carried out after every Ti-PECVD deposition onto a single substrate or at least after a selected number of Ti-PECVD depositions onto a series of substrates.

In one preferred embodiment of the invention, a reactor is opened to the atmosphere and wet cleaned to remove Ti bearing films that have accumulated on the surfaces of reactor components. The reactor is then closed and a vacuum is restored within the reactor. The components of the reactor are then exposed, for a time, to a plasma formed in a mixture of argon and hydrogen gas within the chamber. Particularly, the gas introduction system, preferably in the form of a showerhead, is exposed, for a time of, for example, 1 to 5 minutes, to the $H_2$/Ar plasma. The exposure of the showerhead and other components to the plasma removes contaminants from the component surfaces.

Preferably, the reactor is run through the steps of a Ti-PECVD process but without a wafer in the chamber to pre-coat reactor components with a Ti bearing film. Where the susceptor is made of a metal such as a nickel alloy, the formation of such a pre-coating on the surface of the susceptor prevents the sticking of silicon wafers to the hot susceptor. Preferably, the showerhead is preheated to a temperature that, for a Ti-PECVD reactor or process, is preferably higher than approximately 425° C. An effect of the heating of the showerhead is to improve the adhesion of the Ti bearing film that is deposited when this initial Ti-PECVD process is run in the reactor immediately following the $H_2$/Ar plasma cleaning.

Following the pre-coating of the reactor components, a fast process break-in of the reactor is accomplished by forming a $H_2$/Ar plasma in the reactor before $TiCl_4$ is introduced into the reactor. One advantage of first forming the $H_2$/Ar plasma is that direct exposure of hot metallic surfaces to the $TiCl_4$ gas is prevented.

In accordance with certain embodiments of the invention, a controlled oxidizing or reducing of Ti bearing films, such as by nitridizing or otherwise passivating the film, is carried out in a Ti-PECVD reactor following changes in the nature or extent of Ti bearing films on the reactor components. In certain embodiments of the invention, a controlled deposition of reactants, reaction products, reaction by-products or related materials is provided in the chamber following the cleaning of the chamber. In other embodiments of the invention, a controlled presence of one or more oxidizing or reducing agents is provided in the chamber in the early stages of recovery following a cleaning of the chamber. Still in further embodiments of the invention, films formed on the surfaces of reactor components are oxidized or reduced in a controlled way following the performance of a Ti-PECVD process in the reactor to stabilize the film that may deposit on the components during the performance of such process. Preferably, controlled oxidation or reduction and passivation is carried out after every Ti-PECVD deposition onto a single substrate or after a selected number of Ti-PECVD depositions onto a series of substrates.

In another preferred embodiment of the invention, the reactor is cleaned in situ, without being opened to the atmosphere. Such a cleaning is usually conducted by the introduction of fluorine or chlorine-containing gases into the chamber, frequently forming a plasma therewith. Examples of such gases are nitrogen trifluoride ($NF_3$), trifluorochlorine ($ClF_3$) or chlorine ($Cl_2$). The in situ cleaning process is carried out to remove Ti bearing films and other contaminants that have accumulated on the surfaces of reactor components. Following such in situ cleaning, all such cleaning gases and reaction products are removed from the chamber. The cleaning includes exposing the components of the reactor, for a time, to a plasma formed in a mixture of argon, hydrogen and ammonia gases, for example, as explained following the wet cleaning process discussed above. This plasma cleaning is carried out for 1 to 10 minutes or as is necessary to remove fluorine and chlorine-containing species from the chamber. Then the reactor chamber is pump purged at least five times.

The reactor is, preferably, then run through the steps of a Ti-PECVD process without a wafer in the chamber to pre-coat reactor components with a Ti bearing film, as is done following the wet cleaning process described above. Also, following the pre-coating of the reactor components, a fast process break-in of the reactor is accomplished by forming a $H_2/Ar$ plasma in the reactor before $TiCl_4$ is introduced into the reactor. One advantage of first forming the $H_2/Ar$ plasma is that direct exposure of hot metallic surfaces to the $TiCl_4$ gas is prevented.

In a further preferred embodiment of the invention, the Ti-PECVD process and reactor are maintained stable during the continuous operation of the reactor and performance of the process by performing stabilization steps following individual depositions onto wafers. Ti bearing films that accumulate on reactor components during continuous operation of a Ti-PECVD process that can vary in composition and can result in constant change of reactor and process conditions are stabilized by oxidizing or reducing the films and passivating the films, as appropriate, in a controlled way following individual depositions onto wafers in the chamber, either following a selected number of depositions or, preferably, following each performance of a Ti-PECVD process on a wafer and before each entry of a new wafer into the chamber for similar Ti-PECVD processing.

The stabilization steps include the introduction of controlled quantities of gases such as oxygen ($O_2$) or water vapor ($H_2O$), for example, to form an oxidation reaction with the newly deposited films on the reactor surfaces or the introduction of controlled quantities of gases such as hydrogen ($H_2$), ammonia ($NH_3$), silane ($SiH_4$), methane ($CH_4$) or di-borane ($B_2H_6$), for example, to form a reduction reaction. The gas is caused to flow in the chamber. A plasma may also be formed with the gas to enhance the reaction. $NH_3$ in particular is preferred for the stabilization process and introduced into the chamber with argon energized to an RF plasma, with the susceptor and showerhead heated. The stabilization step following each Ti-PECVD processing of a wafer may typically range from 10 to 60 seconds, depending on conditions.

In a preferred embodiment of the invention, a passivation step is performed in the reactor following each Ti deposition. The passivation step is performed before the wafer on which the Ti film was deposited has been removed from the chamber, such that a subsequent Ti passivation step is performed on Ti film deposited on the wafer at the same time that the passivation step is performed on the Ti film deposited on the reactor components. Where the passivation of the wafer by the formation of a TiN film is desired, following the Ti deposition reaction, $NH_3$ is introduced into the Ti-PECVD reactor chamber and reacted to form a TiN film over the Ti films on the wafer and the reactor components, preferably in a plasma enhanced process. Preferably also, a hydrogen-argon plasma is formed in the reactor with the $NH_3$ being introduced when the temperature of the reactor showerhead is at least at 425° C., with the susceptor temperature at about 630° C., the wafer at about 590° C. and the walls of the reactor at between 100° C. and 200° C.

Alternative passivation gases may be used for the chamber passivation process. Where such gases are not compatible with the processing of the wafer, the wafer may be removed from the chamber and the passivation carried out in the chamber without a wafer present. In such cases, where the film accumulated in the chamber is light, passivation of the chamber may be carried out at intervals following the Ti deposition onto a series of several wafers.

Specific process parameters that are particularly preferred are set forth in detail in the examples and specific embodiments described below.

With the stabilization of material deposited on reactor components in the chamber carried out in a controlled manner, the reactor surfaces reach a conditioned state in the reactor in a very short time, much shorter than would be required otherwise, and changes in process conditions during the performance of Ti-PECVD processes are avoided. While stabilization may occur slowly if left to itself due to reaction with residual water vapor in the chamber, the controlled use of oxidizing or reducing and passivating agents during the process stabilizes the film quickly and in a repeatable manner. In particular, the time required to form a stabilized $TiCl_x$ based coating on reactor surfaces is controlled and significantly reduced. Further, the stabilization of the accumulating film after each deposition during the continuous operation of the reactor renders the process stable for the processing of thousands of wafers. This method is preferred over methods that rely on frequent in situ cleaning and recovery from in situ cleaning.

In particular, from the onset of deposition, such as, for example Ti-CVD, after either a wet clean or chemical cleaning, such as by using $NF_3$, material is deposited on the chamber walls and oxidized or reduced/nitridized into a fully insulating and chemically stable film while avoiding unstable operation or, alternatively, the need for a lengthy break-in period. Typically, following reactor cleaning, stabilization occurs over a period of time comparable to the time it takes for the CVD processing of less than five wafers, typically 1 wafer, where previously about 75 conditioning wafers were required before resuming commercial manufacturing processing of wafers. Even after a long idle time, for example after an overnight shutdown of the equipment, break-in time is typically reduced to zero wafers.

Also, without the stabilizing step of the present invention being performed following the processing of individual wafers, instabilities persist throughout the continuous operation of the reactor. Such passivation of coatings deposited on reactor components between depositions onto wafers in the commercial process enhances process and reactor stabilization. In the case of Ti-CVD, where each deposition onto a wafer results in the deposition of additional metallic titanium onto reactor components, formation of a passivating film on the titanium on the reactor components can be carried out by a treatment of approximately 10 to 60 seconds, typically 30 seconds, with an $NH_3$ plasma between each consecutive process of Ti-CVD onto wafers. This maintains consistent film properties, such as resistivity and film thickness uniformity, as well as consistent deposition rate.

The concepts set forth above have utility for other metal inorganic CVD processes, particularly those used in applying reactive boundary materials in addition to titanium, such as tantalum.

These and other objectives of the present invention will be readily apparent from the following detailed description of the preferred embodiments of the invention.

DETAILED DESCRIPTION OF THE PREFERRED EMBODIMENTS

Preferred embodiments of the present invention involve the processing of semiconductor wafers by chemical vapor deposition (CVD), and particularly by plasma enhanced chemical vapor deposition (PECVD), in a CVD reactor such as that disclosed in U.S. Pat. No. 5,370,739, expressly incorporated by reference herein. The process of particular interest for application of the present invention involves a reaction for the deposition of titanium (Ti) on a silicon wafer by the reduction of $TiCl_4$ by reaction with $H_2$, which produces HCl gas as a by-product. In the performance of such a reaction in a CVD reactor, Ti will deposit on reactor component surfaces, as will other $TiCl_x$ compounds, where x<4. These deposits build up on the reactor component surfaces and, if not periodically cleaned, tend to flake off and contaminate wafers being processed in the chambers.

Cleaning of such a reactor chamber is periodically carried out to remove accumulated reactants, reaction products and reaction by-products from the reactor surfaces. This reactor cleaning may be accomplished either in situ, without opening the system to air and preferably without cooling any parts of the chamber or by wet cleaning, which is performed by cooling the reactor components, opening the system and wiping or scrubbing the reactor components with water or other chemicals to remove deposits from them. Cleaning changes the condition of the surfaces in the CVD reactor by removing the deposits. This change of condition affects deposition processes performed in the reactor causing them to perform somewhat differently immediately following the cleaning than they had immediately preceding the cleaning. Such changes in process performance adversely affect the consistency and quality of the coatings performed on wafers at least until a film has been deposited on reactor components and stabilized. With the embodiments of the invention outlined in FIGS. 1 and 2, these affects are reversed prior to the use of the reactor for further deposition onto wafers.

Figure 1:
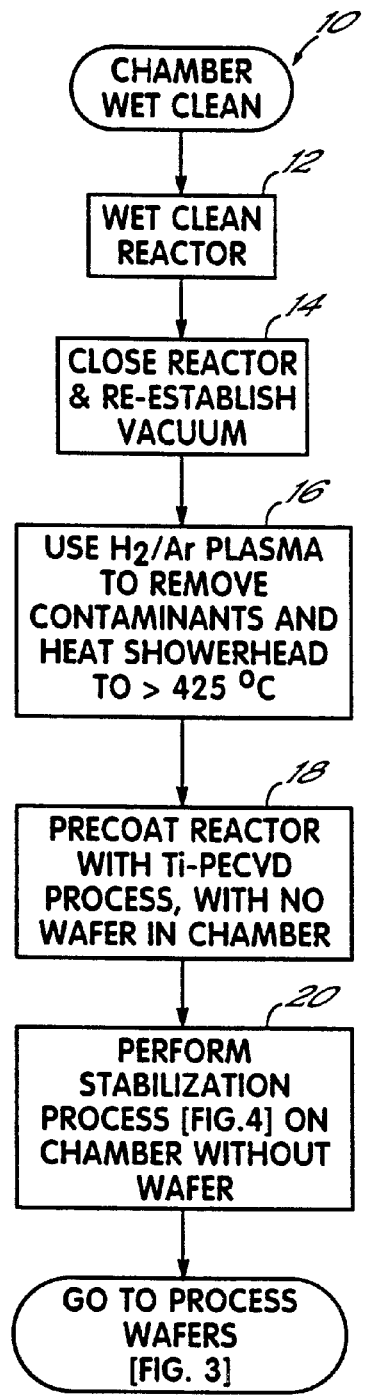
FIG. 1 is a flow diagram of a method embodying principles of the present invention in a wet CVD chamber cleaning process.

One preferred embodiment of the invention depicted in FIG. 1 is a wet cleaning recovery and break-in method 10 for a Ti-PECVD reactor. In the wet cleaning recovery process 10, a reactor is shut down, opened and subjected to a conventional wet cleaning process 12. Following the wet cleaning process 12, the reactor is subjected to standard steps 14 by which the reactor is closed, purged and pumped to a vacuum. Then, a mixture of hydrogen and argon gas are introduced into the reactor and a step 16 is carried out by which an $H_2$/Ar plasma is formed. This plasma is operated for approximately 1 to 5 minutes, or until any remaining contaminants are removed from the showerhead and other nearby components and until the showerhead has been heated to at least 425° C. by the plasma. During this plasma cleaning and heating step 16, the pressure in the reactor is maintained at approximately 2 to 10 Torr, with argon introduced at a rate of approximately 150–450 sccm (cubic centimeters per minute if measured at standard temperature and pressure), with hydrogen introduced at 750–5000 sccm. The plasma is energized with approximately 250–750 watts of RF power at 450 kHz. The susceptor of the reactor, which is typically equipped with a heating system such as an internal resistance heater, is also heated to a temperature that would bring its wafer support surface to approximately 590° C., which typically would require a resistance heater to be heated to approximately 630° C. The walls of the reactor, which are typically also equipped with heater elements, are maintained at between approximately 100° C. to 200° C.

When the contaminants have been removed by the plasma and the components have been brought to the appropriate temperatures, a Ti-PECVD process 18 is run in the chamber of the reactor without a wafer present on the susceptor. The running of this process coats, with a thin Ti bearing film, the surface of the susceptor, the showerhead, the walls of the reactor and other surfaces of internal reactor components. The deposition is carried out by first initiating an Ar/$H_2$ plasma before introducing $TiCl_4$ gas for the Ti deposition reaction. The initiation of the plasma prevents the hot metallic surfaces, such as a nickel alloy susceptor if present, to form detrimental metal chlorides. The Ti deposition process is carried out with the pressure in the reactor maintained at approximately 2 to 10 Torr, with $TiCl_4$ introduced at a rate of approximately 2.5–7.5 sccm, with hydrogen introduced at a rate of approximately 750–5000 sccm and with argon introduced at a rate of approximately 150–450 sccm. The plasma is energized with approximately 250–750 watts of RF power at 450 kHz. The susceptor of the reactor is maintained at a temperature that would bring its wafer support surface to approximately 590° C., which typically would require a resistance heater to be heated to approximately 630° C. The showerhead is maintained at a temperature of at least about 425° C., and the walls of the reactor are maintained at between approximately 100° C. to 200° C. If the susceptor is not made of a metal such as nickel, facilitating deposition onto the susceptor is not necessary.

Following the Ti-PECVD pre-coating 18 of the chamber, a stabilization or passivation step 20 is carried out on the Ti rich film that has been deposited on chamber components. With the wet cleaning and break-in method 10, the reactor cleaning is accompanied by deposition of a stabilized titanium film through the controlled reaction of deposited Ti film through a controlled introduction of an oxidizing or reducing agent provided into the chamber. The stabilization process 50 of step 20 is described in more detail in connection with the discussion of FIG. 4, below. Once the reactor has been cleaned according to method 10, continuous processing of wafers may be carried out in the chamber, preferably by a method as described in connection with FIG. 3 below.

Figure 2:
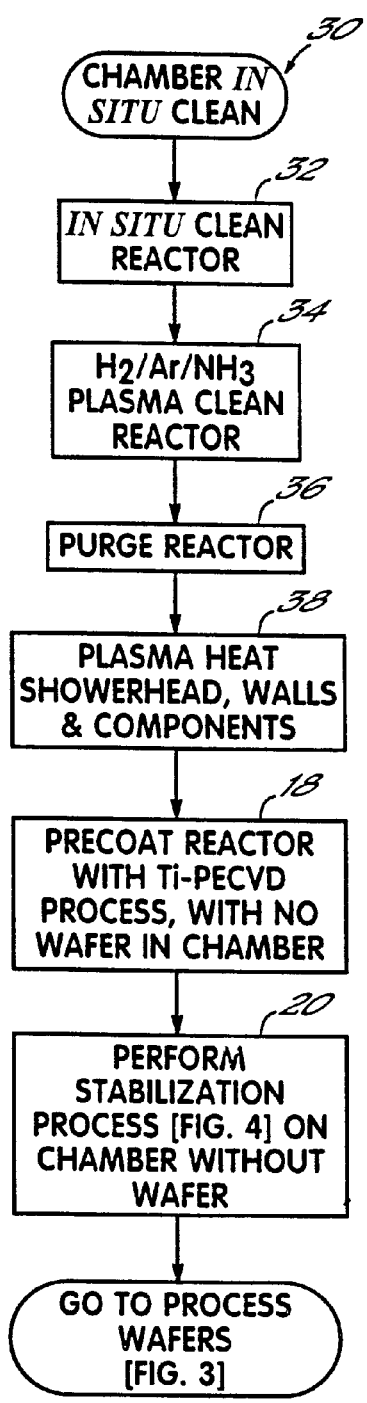
FIG. 2 is a flow diagram similar to FIG. 1 of a method embodying principles of the present invention in an in situ CVD chamber cleaning process.

FIG. 2 depicts an in situ cleaning and break-in method 30 according to another preferred embodiment of the invention.

In the method 30, the reactor is kept sealed and in a vacuum state and subjected, with wafers removed, to a conventional in situ cleaning process 32, in which a cleaning gas such as $NF_3$, $ClF_3$ or $Cl_2$ is employed, typically with a plasma, to remove the deposited films from the reactor surfaces. Following the in situ cleaning process 32, the reactor is subjected to the step 34 of generating an $NH_3/H_2/Ar$ plasma formed for approximately 1 to 10 minutes to remove any remaining cleaning gases and contaminants from the reactor. Then the reactor is subjected to a series 36 of pump purging cycles, preferably at least five in number, in which the reactor chamber is pressurized to approximately 5 to 20 Torr of inert gas, such as argon or nitrogen, and then pumped down to less than 1 Torr. Then, if necessary, $H_2/Ar$ plasma is used to heat the showerhead to at least 425° C. as in the plasma cleaning and heating step 16 described in connection with the wet cleaning process 10 above. The pressure in the reactor is maintained at approximately 2 to 10 Torr, with argon introduced at a rate of approximately 150–450 sccm, with hydrogen introduced at 750–5000 sccm. The plasma is energized with approximately 250–750 watts of RF power at 450 kHz. The susceptor of the reactor is maintained at a temperature that would bring its wafer support surface to approximately 590° C., the walls of the reactor are maintained at between approximately 100° C. to 200° C., and the showerhead maintained at least about 425° C. Then, the reactor is subjected to the Ti-PECVD process step 18 as described above, with no wafer in the chamber, and the stabilization process 50 of step 20 is carried out on the Ti rich film that has been deposited on chamber components. When the reactor has been cleaned according to method 30, continuous processing of wafers may be carried out in the chamber, preferably by a method as described in connection with FIG. 3 below.

Figures 3, 4:
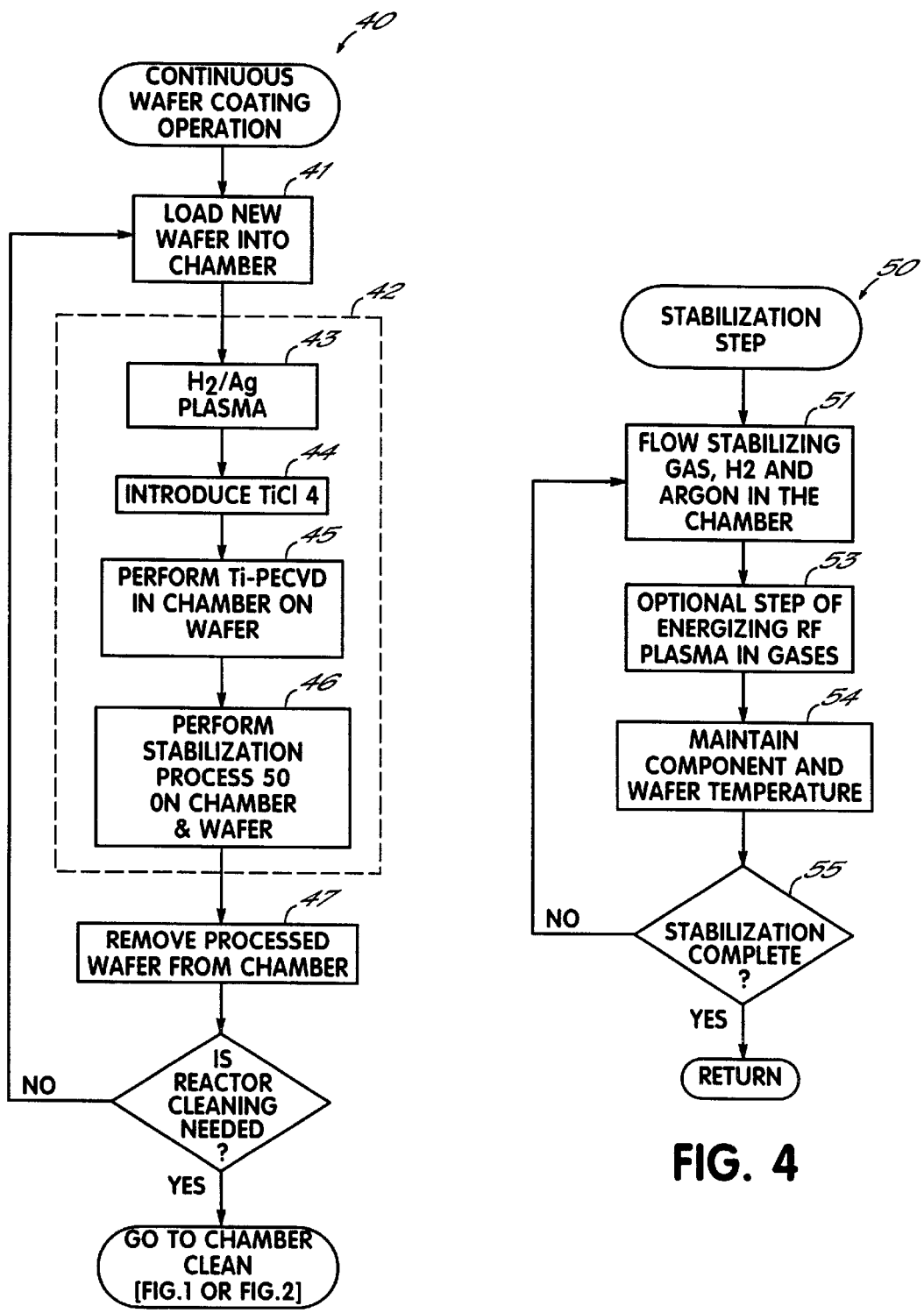
FIG. 3 is a flow diagram similar to FIGS. 1 and 2 of a method embodying principles of the present invention in the continuous CVD processing and passivation of substrates.
FIG. 4 is a flow diagram illustrating in more detail a preferred stabilization step of the processes of FIGS. 1–3.

The continuous operation of a reactor for Ti-PECVD of wafers is preferably carried out in accordance with method 40 depicted in FIG. 3. In the continuous wafer processing method 40, a new wafer in need of processing with a Ti-PECVD process is loaded (step 41) into the reactor chamber. Such a wafer may typically be a silicon semiconductor wafer having semiconductor devices partially formed thereon, usually with an upper insulating layer having a pattern of small high aspect ratio holes therethrough which expose conductive contacts and which are to be coated with a layer of titanium prior to the application of an upper conductive metal layer of a material such as tungsten with which the contacts are to electrically connect. Then, a Ti-PECVD process 42 is performed on the wafer.

The Ti-PECVD process 42 is preferably performed first initiating an $H_2/Ar$ plasma in the chamber (step 43) followed by the introduction of $TiCl_4$ (step 44) and the performance of the titanium reduction reaction by Ti-PECVD (step 45). The Ti-PECVD step 45 is preferably performed under the conditions of approximately 2 to 10 Torr, $TiCl_4$ at approximately 2.5–7.5 sccm, hydrogen at approximately 750–5000 sccm, argon at approximately 150–450 sccm, approximately 250–750 watts of RF power at 450 kHz to the plasma, wafer temperature of about 590° C., showerhead temperature of at least 425° C., and reactor wall temperature at approximately 100° C.–200° C. When the Ti-PECVD step 45 is complete, a stabilization step 46 is performed in the reactor which includes both the passivating of the Ti coating on the wafer and as well as stabilizing the Ti deposits on the surfaces of the reactor components. The preferred passivation or stabilization step 46 is preferably one performed with an $NH_3$ plasma to form a TiN layer over the Ti film on the wafer and on the reactor components, but it may include alternative processes as described in connection with FIG. 4 below. It is found that the passivation time needed for such a step to stabilize the Ti film on the reactor components is less than the passivation time required to form a TiN film on the wafer, so that a TiN processing time suitable for TiN processing of the wafer can also be used to passivate the chamber. The passivation step 46 proceeds in accordance with a passivation process described in connection with FIG. 4, below. When the passivation step 46 is complete, the entire Ti-PECVD process according to this embodiment of the invention is complete, and the processed wafer is removed from the chamber (step 47). If, at this time, the chamber is not in need of cleaning, and further wafers need to be processed by Ti-PECVD, the process 40 is repeated with a new wafer loaded into the reactor chamber. Otherwise, reactor cleaning can be performed according to the methods 10 or 30 of FIGS. 1 or 2. During this continuous wafer coating operation thousands of wafers can be processed before an in situ clean is necessary.

The stabilization process 50 may be substantially the same for either the process of stabilizing an empty chamber after cleaning by step 20 or the process of passivating a wafer and stabilizing the surfaces of the chamber after a deposition onto a wafer as included in step 46. The substeps of such a stabilization process are depicted in detail in FIG. 4 as including the step 51 of introducing, after every deposition of titanium with or without a wafer in the chamber, of a stabilization gas, $H_2$ gas and argon, with or without the application of a plasma. The stabilizing gas may be an oxidizing gas or a reducing gas or a gas which otherwise passivates the films on a wafer or on components of the chamber. The step of 51 includes the flowing of stabilization gas in the chamber at a flow rate of about 10–1000 sccm, of $H_2$ at a flow rate of approximately 500–5000 sccm, and of argon at a flow rate of about 50–500 sccm. The process 50 includes the optional step 53 of employing a plasma energized at about 250–750 watts RF. The process also includes the step 54 of maintaining the temperature of the components of the chamber at temperatures appropriate for the reaction of the reactants involved. Finally, the process 50 includes the step of 55 allowing the chamber to idle under these conditions for a time sufficient for the stabilizing reactions and passivation of the Ti films to occur.

The selection of stabilizing gas is dependent on the selection of any one of several possible passivating reactions, which can be either oxidation reactions or reduction reactions. Oxidation reactions may utilize oxidizing species such as oxygen ($O_2$) or water ($H_2O$), and may involve the oxidizing reactions of:

$$TiCl_x + yO = TiCl_xO_y$$

and $$TiCl_x + yH_2O = TiO_y + HCl.$$

Reduction reactions may utilize reducing species such as hydrogen ($H_2$), nitrogen ($N_2$), ammonia ($NH_3$), silane ($SiH_4$), methane ($CH_4$), and di-borane ($B_2H_6$), and may involve the reducing reactions of:

$$TiCl_x + H_2 = Ti + HCl,$$

$$Ti + N_2 = TiN,$$

$$TiCl_x + NH_3 = TiN + HCl \text{ (high temperature)},$$

$$TiCl_x + yNH_3 = (TiCl_x)(NH_3)_y \text{ (low temperature)},$$

$TiCl_x+SiH_4=TiSi_2+HCl,$ $TiCl_x+CH_4=TiC_2+HCl,$ and $TiCl_x+B_2H_6=TiB+HCl.$ In these reactions, argon may be used as a carrier gas.

In a preferred embodiment, an $NH_3$ stabilization gas is used under conditions that will produce a stabilizing reaction of $TiCl_x+NH_3=TiN+HCl$. For such a reaction, preferred process conditions are:

gas flow substep 51:

| total pressure | 2–10 Torr |
|---|---|
| argon flow rate | 150–450 sccm |
| nitrogen flow rate | 0–5000 sccm |
| ammonia flow rate | 500–5000 sccm | plasma substep 53:

| plasma power | 250–750 Watts |
|---|---|
| plasma power frequency | 450 kHz | temperature maintaining substep 54:

| wafer temperature | 590° C. |
|---|---|
| susceptor temperature | 630° C. |
| showerhead temperature | >425° C. |
| chamber wall temperature | 100–200° C. | and, stabilization time substep:
stabilization step time approx. 10–60 seconds (depending on Ti-PECVD process conditions).

Where other stabilization reactions are used, stabilization process conditions would be such conditions as are determinable by those skilled in the art for the passivating of a titanium film on a wafer with the selected stabilizing reaction. It is preferable, however, that the stabilization for the chamber be a reaction that is compatible with the manufacture of the wafer being processed. If it is not, then the stabilization of the chamber is performed in a process that is separate from the stabilization of a wafer and without a wafer in the chamber. This involves the consecutive performance of a stabilization process on the chamber and the performance of a stabilization process on the wafer. Generally, the use of different stabilization reactions for the stabilization of the chamber and of the wafer adversely affects throughput to an unacceptable degree. This may also be the case were the passivation of the chamber will take too long for the performance of the passivation process on a wafer, even when the same process is used. For whatever reason, where the processes are to be performed consecutively on the wafer or on the chamber, the process is most practical where the chamber need not be stabilized after every deposition onto a wafer but may be stabilized after every two, three or some other number of depositions, for which principles of the invention can be employed.

Practice of the invention described above can be enhanced by reference to the following U.S. patents and applications of the applicants' assignee, which are hereby expressly incorporated by reference herein: U.S. Pat. Nos. 5,665,640, 5,667,243 and 5,593,511 and U.S. patent application Ser. No. 08/253,978.

Other embodiments in addition to the those discussed in detail above can be made. Those skilled in the art will appreciate that the applications of the present invention herein are varied, and that the invention has been primarily described in preferred embodiments. Accordingly, additions and modifications can be made without departing from the principles of the invention.

What is claimed is:

1. A method of maintaining the stability of a PECVD processing chamber for the plasma enhanced chemical vapor deposition of titanium onto substrates when supported therein comprising the steps of:
   following the plasma enhanced chemical vapor deposition of titanium in the reactor during which $TiCl_x$ is deposited onto and coats surfaces of components of the chamber:
      introducing an oxidizing or reducing gas into the chamber and exposing thereto $TiCl_x$ coated surfaces of components of the chamber for a period of time sufficient to allow the deposited material to stabilize the $TiCl_x$ coated surfaces.

2. The method of claim 1 wherein the step of introducing the oxidizing or reducing gas into the chamber and exposing thereto the $TiCl_x$ coated surfaces of components of the chamber for a period of time sufficient to allow the deposited material to stabilize the $TiCl_x$ on the surfaces is performed following a deposition of titanium onto a substrate in the chamber and prior to the introduction of another substrate into the chamber for Ti-PECVD processing in the chamber.

3. The method of claim 2 wherein the step of introducing the oxidizing or reducing gas into the chamber and exposing thereto $TiCl_x$ coated surfaces of components of the chamber for a period of time sufficient to allow the deposited material to stabilize the $TiCl_x$ on the surfaces is performed following a deposition of titanium successively onto each of a plurality of substrates in the chamber and is performed after each deposition of titanium onto each substrate of the plurality of substrates in the chamber and prior to the introduction of the each next substrate of the plurality into the chamber for Ti-PECVD processing in the chamber.

4. The method of claim 3 wherein:
   the step of introducing the oxidizing or reducing gas into the chamber and exposing thereto $TiCl_x$ coated surfaces of components of the chamber for a period of time sufficient to allow the deposited material to stabilize the $TiCl_x$ on the surfaces is performed following a deposition of titanium onto a substrate in the chamber and prior to the removal of the substrate from the chamber; and
   the method further comprises the step of passivating the substrate in the chamber prior to the removal thereof.

5. The method of claim 4 wherein the step of passivating the substrate is performed simultaneously with the exposing of the $TiCl_x$ coated surfaces of components of the chamber to the oxidizing or reducing gas by exposing a titanium-containing film on the substrate to the same oxidizing or reducing gas.

6. The method of claim 5 wherein the step of introducing the oxidizing or reducing gas into the chamber includes the step of introducing ammonia gas into the chamber and exposing $TiCl_x$ coated surfaces thereto to form a stable nitride compound of the $TiCl_x$ on the surfaces.

7. The method of claim 6 wherein the step of introducing the ammonia gas into the chamber and exposing $TiCl_x$ coated surfaces thereto is carried out at a pressure of approximately 2 to 10 Torr, with ammonia flow rate of approximately 500–5000 sccm, with argon flow rate of approximately 150–450 sccm, and with a plasma power at approximately 250–750 Watts at 450 kHz RF, and for a time of at least 10 seconds.

8. The method of claim 1 wherein the step of introducing the oxidizing or reducing gas into the chamber and exposing $TiCl_x$ coated surfaces thereto is carried out at a pressure of approximately 2 to 10 Torr, with the flow rate of oxidizing or reducing gas at approximately 10–5000 sccm, with hydrogen flow rate of approximately 500–5000 sccm, with argon flow rate of approximately 50–500 sccm, and with a plasma power at approximately 250–750 Watts RF, and for a time of at least 10 seconds.

9. The method of claim 1 wherein the step of introducing the oxidizing or reducing gas into the chamber and exposing $TiCl_x$ coated surfaces thereto is carried out with a gas introducing showerhead within the chamber maintained at a temperature of at least 425° C.

10. The method of claim 1 wherein the step of introducing the oxidizing or reducing gas into the chamber and exposing $TiCl_x$ coated surfaces thereto is carried out with titanium bearing surfaces within the reactor maintained at a temperature of at least 100° C.

11. The method of claim 1 wherein the step of introducing the oxidizing or reducing gas into the chamber includes the step of introducing a gas selected from the group consisting of $NH_3$, $H_2$, $N_2$, $O_2$, $H_2O$, $SiH_4$, $B2H_6$ and $CH_4$.

12. The method of claim 1 further comprising the steps of:
introducing a mixture of argon and hydrogen gases into the chamber at a vacuum pressure level;
before a titanium-containing reactant gas is introduced into the chamber, producing a plasma adjacent surfaces of reactor components with the gases in the chamber;
introducing titanium-containing reactant gas into the chamber and chemically reducing the gas to cause the deposition of a titanium-containing film within the chamber.

13. The method of claim 1 further comprising the steps of:
following a cleaning of the surfaces of components of the chamber and prior to the introduction of a substrate into the chamber for Ti-CVD processing:
introducing a titanium-containing reactant gas into the chamber and chemically reducing the gas to cause the deposition of a titanium-containing film on the heated components of the reactor; and
then, performing the step of introducing the oxidizing or reducing gas into the chamber and exposing thereto $TiCl_x$ coated surfaces of components of the chamber for a period of time sufficient to allow the deposited material to stabilize the $TiCl_x$ coated surfaces.

14. The method of claim 13 further comprising the steps of:
following a cleaning of the surfaces of components of the chamber and prior to the step of introducing the titanium-containing reactant gas into the chamber and chemically reducing the gas to cause the deposition of $TiCl_x$ on the heated components of the reactor:
introducing a mixture of argon and hydrogen gases into the chamber at a vacuum pressure level;
producing a plasma adjacent surfaces of reactor components with the gases in the chamber and raising the temperature of a reactor component therewith.

15. A method of cleaning a CVD processing chamber of a reactor for use in the chemical vapor deposition of a coating material onto a surface of a substrate therein comprising the steps of:

cleaning the chamber to remove, from the surfaces of components of the reactor, previously deposited coating material that is in a state that affected the process conditions that existed in the chamber prior to the cleaning thereof;
introducing a mixture of inert and reactant gases into the chamber at a vacuum pressure level;
producing a plasma with the gases in the chamber and raising the temperature of a reactor component therewith;
then, introducing a coating material containing reactant gas into the chamber and chemically reacting it to cause the deposition of a coating material film on the surfaces of heated components in the chamber; and
then, introducing an oxidizing or reducing gas into the chamber and contacting therewith the coating material film on the surfaces of the components for a period of time sufficient to stabilize the deposited coating material film to restore the affect on the process conditions to the state that existed in the chamber prior to the cleaning of the previously deposited coating material from the surfaces of the components of the reactor.

16. The method of claim 15 wherein the cleaning step includes the step of opening and wet cleaning components of the chamber of the reactor.

17. The method of claim 15 wherein the cleaning step includes the step of in situ cleaning components of the chamber of the reactor with the chamber closed and under vacuum.

18. The method of claim 15 wherein:
the cleaning step includes the step of cleaning the chamber to remove previously deposited titanium compounds from the surfaces of components of the reactor;
the mixture introducing step includes the step of introducing a mixture of argon and hydrogen gases into the chamber at a vacuum pressure level;
the plasma producing step includes the step of producing a plasma in the mixture of argon and hydrogen gases and raising the temperature of a reactor component therewith;
the coating material introducing step includes the step of introducing $TiCl_4$ gas into the plasma previously formed in the mixture of argon and hydrogen gases in the chamber and chemically reducing the $TiCl_4$ gas with the hydrogen gas to cause a titanium film deposition reaction to occur in the chamber during which $TiCl_x$ (x<4) is deposited on surfaces of components in the chamber; and
the oxidizing and reducing gas introducing step includes the step of introducing oxidizing or reducing gas into the chamber following the deposition of the $TiCl_x$ and contacting therewith the $TiCl_x$ (x<4) on the surfaces of the components for a period of time sufficient to stabilize the deposited $TiCl_x$ (x<4) by converting it to a stable form.

19. The method of claim 18 wherein:
the plasma producing step includes the step of raising the temperature of a showerhead within the chamber to a temperature of at least 425° C.

20. The method of claim 18 wherein:
the oxidizing and reducing gas introducing step includes the step of introducing $NH_3$ gas into the chamber and contacting therewith the $TiCl_x$ (x<4) on the surfaces of the components for a period of time sufficient to convert it to $TiNCl_x$.

21. The method of claim 15 further comprising, after the step of introducing an oxidizing or reducing gas into the chamber and contacting therewith the film on the surfaces of the components for a period of time sufficient to stabilize the deposited film:

introducing a substrate into the chamber;

introducing $TiCl_4$ gas into the chamber and chemically reducing it with the hydrogen gas to cause the deposition of a titanium film onto a surface of the substrate.

22. The method of claim 21 further comprising, after the deposition of titanium onto the substrate:

again introducing an oxidizing or reducing gas into the chamber and contacting therewith the film on surfaces of components of the reactor for a period of time sufficient to stabilize the deposited film; and before further cleaning of the chamber, introducing another substrate into the chamber and processing the substrate by performing a CVD process to deposit the coating material film thereon.

23. The method of claim 21 further comprising, after the substrate introducing step:

before removing the substrate from the chamber, again introducing an oxidizing or reducing gas into the chamber and contacting therewith the film on the surface of the substrate for a period of time sufficient to stabilize the film deposited on the surface of the substrate.

24. The method of claim 21 wherein the step of again introducing the oxidizing or reducing gas includes the step of introducing ammonia gas into the chamber and contacting therewith the film on the surface of the substrate for a period of time sufficient to stabilize the film deposited on the surface of the substrate by forming a titanium and nitrogen containing layer thereon.

25. A method of depositing a titanium film on the surface of a substrate and passivating the deposited titanium film, comprising the steps of:

introducing a mixture of argon and hydrogen gases into a vacuum chamber;

introducing $TiCl_4$ gas into the chamber and chemically reducing it with the hydrogen gas to cause the deposition of a titanium film on a surface of the substrate and to cause deposits of $TiCl_x$ on surfaces of reactor components within the chamber; and then, with the substrate still in the chamber, introducing a passivating gas into the chamber and contacting therewith the titanium film on the surface of the substrate for a period of time sufficient to stabilize the deposited titanium bearing films on the substrate; and introducing a stabilizing gas into the chamber and stabilizing therewith the $TiCl_x$ on the surfaces of the components.

26. The method of claim 25 wherein:

the stabilizing is performed with the substrate still in the chamber by introducing a passivating and stabilizing gas into the chamber and contacting therewith the titanium film on the surface of the substrate and the $TiCl_x$ on the surfaces of the reactor components for a period of time sufficient to passivate the deposited titanium film on the substrate and to stabilize the $TiCl_x$ on the surfaces of the components.

27. The method of claim 25 wherein:

the step of introducing the mixture of argon and hydrogen gases into the chamber includes the step of forming a plasma in the mixture.

28. The method of claim 25 further comprising the step of:

maintaining a showerhead in the chamber at a temperature of at least 425° C. while depositing titanium in the reactor and while contacting the stabilizing gas with the deposited film.

29. A method of maintaining the stability of a CVD reactor chamber for the plasma enhanced chemical vapor deposition of a metal containing material onto substrates when supported therein comprising the steps of:

following plasma enhanced chemical vapor deposition of the material onto a substrate in the reactor chamber, prior to the removal of the substrate from the reactor chamber and the introduction of another substrate into the reactor chamber, introducing a stabilizing gas into the chamber to passivate the material deposited on the substrate while simultaneously exposing the surfaces of components of the reactor chamber that have been coated with unstable volatile compounds of the material to the stabilizing gas for a period of time sufficient to allow the compound of the material deposited on the surfaces of the components of the reactor chamber to stabilize to form a non-volatile film over which further unstable volatile compounds will be deposited when plasma enhanced chemical vapor deposition is repeated.

\* \* \* \* \*

UNITED STATES PATENT AND TRADEMARK OFFICE
CERTIFICATE OF CORRECTION

PATENT NO. : 6,635,569 B1
DATED : October 21, 2003
INVENTOR(S) : Michael S. Ameen et al.

It is certified that error appears in the above-identified patent and that said Letters Patent is hereby corrected as shown below:

Title page, Item [54] and Column 1, lines 1-5,
Title, reads "A TI-PECVD PROCESS CHAMBER AND COMBINED TI-PECVD/TIN-CVD" and should read -- A Ti-PECVD PROCESS CHAMBER AND COMBINED Ti-PECVD/TiN-CVD -- .

Title page,
Item [57], ABSTRACT,
Line 4, reads "...cleaning or in-situ chemical cleaning,..." and should read -- ...cleaning or in situ chemical cleaning,... --.
Line 12, reads "...wafers between in-situ cleaning of the chamber." and should read -- ...wafers between in situ cleaning of the chamber... --.

Drawings,
Sheet 2, reads "$H_2$/Ag PLASMA" and should read -- $H_2$/Ar PLASMA --.
Sheet 2, reads "INTRODUCE TiCl 4" and should read -- INTRODUCE $TiCl_4$ --.
Sheet 2, reads "FLOW STABILIZING GAS, H2 AND ARGON IN THE CHAMBER" and should read -- FLOW STABILIZING GAS, $H_2$ AND ARGON IN THE CHAMBER --.

Column 1,
Line 7, reads "This invention relates seminconductor substrate..." and should read -- This invention relates to semiconductor substrate... --.

Column 2,
Line 39, reads "...composition of these films range from..." and should read -- ...composition of these films ranges from... --.

Column 3,
Line 6, reads "... overlying TiN films is carried out..." and should read -- ...overlying TiN films are carried out... --.
Line 30 reads "...wet cleaning or by in-situ cleaning..." and should read -- ...wet cleaning or by in situ cleaning... --.
Lines 35-34 read "...to provide an in-situ PECVD reactor..." and should read -- ...to provide an in situ PECVD reactor... --.
Line 41, reads "...that are volatile..." and should read -- ...that is volatile... --.

Column 4,
Lines 22-25, read "Particularly, the gas introduction system, preferably in the form of a showerhead, is exposed, for a time of, for example, 1 to 5 minutes, to the..." and should read -- Particularly the gas introduction system, preferably in the form of a showerhead, is exposed for a time of for example 1 to 5 minutes, to the... --.

UNITED STATES PATENT AND TRADEMARK OFFICE
CERTIFICATE OF CORRECTION

PATENT NO. : 6,635,569 B1
DATED : October 21, 2003
INVENTOR(S) : Michael S. Ameen et al.

It is certified that error appears in the above-identified patent and that said Letters Patent is hereby corrected as shown below:

Column 10,
Line 67, reads "...(NH$_{3)y...}$" and should read -- ...(NH$_3)_{y...}$ --.

Column 11,
Line 39, reads "(depending on Ti-PECVD process conditions." and should read
-- (depending on Ti-PECVD process conditions.) --.

Column 12,
Line 3, reads "... addition to the those discussed..." and should read -- ...addition to those discussed... --.
Lines 40-41, reads "... the introduction of the each next..." and should read -- ...the introduction of each next... --.
Line 27, reads "... B2H$_6$ ..." and should read -- ... B$_2$H$_6$... --.
Lines 46-51, read "... then, performing the step of introducing the oxidizing or reducing gas into the chamber and exposing thereto TiCl$_x$ coated surfaces of components of the chamber for a period of time sufficient to allow the deposited material to stabilize the TiCl$_x$ coated surfaces." All text should be double indented, aligning directly under the text "...heated components of the reactor; and".

Column 16,
Lines 25-26, read "...the stability of a CVD reactor chamber..." and should read -- ...the stability of a PECVD reactor chamber --.

Signed and Sealed this

Twenty-second Day of March, 2005

JON W. DUDAS
*Director of the United States Patent and Trademark Office*

UNITED STATES PATENT AND TRADEMARK OFFICE
CERTIFICATE OF CORRECTION

PATENT NO. : 6,635,569 B1
DATED : October 21, 2003
INVENTOR(S) : Michael S. Ameen et al.

It is certified that error appears in the above-identified patent and that said Letters Patent is hereby corrected as shown below:

Title page, Item [54] and Column 1, lines 1-5,
Title, reads "A TI-PECVD PROCESS CHAMBER AND COMBINED TI-PECVD/TIN-CVD" and should read -- A Ti-PECVD PROCESS CHAMBER AND COMBINED Ti-PECVD/TiN-CVD -- .

Title page,
Item [57], ABSTRACT,
Line 4, reads "...cleaning or in-situ chemical cleaning,..." and should read -- ...cleaning or in situ chemical cleaning,... --.
Line 12, reads "...wafers between in-situ cleaning of the chamber." and should read -- ...wafers between in situ cleaning of the chamber... --.

Drawings,
Sheet 2, reads "$H_2$/Ag PLASMA" and should read -- $H_2$/Ar PLASMA --.
Sheet 2, reads "INTRODUCE TiCl 4" and should read -- INTRODUCE $TiCl_4$ --.
Sheet 2, reads "FLOW STABILIZING GAS, H2 AND ARGON IN THE CHAMBER" and should read -- FLOW STABILIZING GAS, $H_2$ AND ARGON IN THE CHAMBER --.

Column 1,
Line 7, reads "This invention relates seminconductor substrate..." and should read -- This invention relates to semiconductor substrate... --.

Column 2,
Line 39, reads "...composition of these films range from..." and should read -- ...composition of these films ranges from... --.

Column 3,
Line 6, reads "... overlying TiN films is carried out..." and should read -- ...overlying TiN films are carried out... --.
Line 30, reads "...wet cleaning or by in-situ cleaning..." and should read -- ...wet cleaning or by in situ cleaning... --.
Lines 35-34 read "...to provide an in-situ PECVD reactor..." and should read -- ...to provide an in situ PECVD reactor... --.
Line 41, reads "...that are volatile..." and should read -- ...that is volatile... --.

Column 4,
Lines 22-25, read "Particularly, the gas introduction system, preferably in the form of a showerhead, is exposed, for a time of, for example, 1 to 5 minutes, to the..." and should read -- Particularly the gas introduction system, preferably in the form of a showerhead, is exposed for a time of for example 1 to 5 minutes, to the... --.

UNITED STATES PATENT AND TRADEMARK OFFICE
CERTIFICATE OF CORRECTION

PATENT NO. : 6,635,569 B1
DATED : October 21, 2003
INVENTOR(S) : Michael S. Ameen et al.

It is certified that error appears in the above-identified patent and that said Letters Patent is hereby corrected as shown below:

Column 10,
Line 67, reads "...$(NH_{3)y...}$" and should read -- ...$(NH_3)_{y...}$ --.

Column 11,
Line 39, reads "(depending on Ti-PECVD process conditions." and should read
-- (depending on Ti-PECVD process conditions.) --.

Column 12,
Line 3, reads "... addition to the those discussed..." and should read -- ...addition to those discussed... --.
Lines 40-41, reads "... the introduction of the each next..." and should read -- ...the introduction of each next... --.

Column 13,
Line 27, reads "... B2H$_6$ ..." and should read -- ... $B_2H_6$... --.
Lines 46-51, read "... then, performing the step of introducing the oxidizing or reducing gas into the chamber and exposing thereto $TiCl_x$ coated surfaces of components of the chamber for a period of time sufficient to allow the deposited material to stabilize the $TiCl_x$ coated surfaces. "–All text should be double indented, aligning directly under the text "...heated components of the reactor; and".

Column 16,
Lines 25-26, read "...the stability of a CVD reactor chamber..." and should read -- ...the stability of a PECVD reactor chamber --.

Signed and Sealed this

Fifth Day of July, 2005

JON W. DUDAS
*Director of the United States Patent and Trademark Office*